(12) United States Patent
Chen

(10) Patent No.: US 6,839,294 B2
(45) Date of Patent: Jan. 4, 2005

(54) MEMORY DEVICE WITH HIGH CHARGING VOLTAGE BIT LINE

(75) Inventor: Chieng-Chung Chen, Hsinchu (TW)

(73) Assignee: Windbond Electronics Corporation, Hsin-Chu (TW)

( * ) Notice: Subject to any disclaimer, the term of this patent is extended or adjusted under 35 U.S.C. 154(b) by 0 days.

(21) Appl. No.: 10/378,231

(22) Filed: Mar. 3, 2003

(65) Prior Publication Data

US 2004/0174758 A1 Sep. 9, 2004

(51) Int. Cl.[7] .............................................. G11C 11/00
(52) U.S. Cl. .................. 365/203; 365/207; 365/189.09
(58) Field of Search ................................. 365/203, 207, 365/189.09, 190, 189.11

(56) References Cited

U.S. PATENT DOCUMENTS 5,737,276 A * 4/1998 Shin et al. .................. 365/203
6,351,422 B2 * 2/2002 Rohr et al. .................. 365/203

* cited by examiner

*Primary Examiner*—David Lam
(74) *Attorney, Agent, or Firm*—Clement Cheng

(57) ABSTRACT

A memory device with high charging voltage bit lines, comprising: memory cells, sense amplifiers, and high charging voltage bit line circuits. Herein, the memory cell is used to store data and electrically couples with a pair of bit lines. The sense amplifier with a pair of sense nods, which electrically couples with the pair of bit lines, is used to sense the differential voltage levels of the pair of sense nodes while the memory cell is active. The high charging voltage bit line circuit is used to provide a charging voltage, which is higher than the logical high voltage of the memory cell, for charging the memory cell.

20 Claims, 4 Drawing Sheets

MEMORY DEVICE WITH HIGH CHARGING VOLTAGE BIT LINE

BACKGROUND OF THE INVENTION

1. Field of the Invention

This invention generally relates to the field of a memory device with high charging voltage bit lines. More particularly, the present invention relates to a memory device with the pairs of bit lines, which can provide a higher voltage than the logical high voltage for the capacitors of the memory to save more electric charges.

2. Description of the Prior Art

A basic unit M of Dynamic Random Access Memory (DRAM) includes a transistor 12 and a capacitor 10, as shown in FIG. 1A. The logical status, 1 or 0, of the DRAM is decided by the capacitor 10. This is, the capacitor 10 can save a fixed amount of electric charges, and a full charging capacitor can be seen as logical 1, but an empty one represents logical 0. However, the capacitor 10 has a problem of leakage current, which results in the gradual loss of inner electric charges, so the electric charges cannot be kept on the original status. This situation makes the original logical status changed as time goes on. Therefore, the memory needs to be continuously charged during a period to temporarily hold the logical status and retain the accuracy in the logical status. Moreover, the memory cannot be read during the charging cycle. Reading data from the memory violates not only to the electric charges but also to the logical status. Hence, the DRAM needs to be refreshed (or to be written back or to be recharged) after every reading to keep the consistency of the contents. Therefore, the memory needs to be refreshed after not only a fixed period but also every reading.

As shown in FIG. 1B, each unit M of the DRAM represents one bit and has a unique address, which is assigned by a row address and a column address. The design of the unit M of the DRAM cannot be read alone in order to simplify the structure of the memory. Hence, many basic units of the DRAM are connected to the same Word Line (WL) and to the same Bit Line (BL) to form an array structure. Each array structure is connected to a sense amplifier via a pass gate to amplify the electric charges, which are read from (or written to) the basic units. Herein, the pass gate includes two N type transistors, N1 and N2. The sense amplifier includes two N type and two P type transistors, N3, N4, P1 and P2.

FIG. 1C illustrates the operation timings among the parts. The basic unit M of the memory has to be set in an active status before reading or writing, and this status is ended after a retaining period, as shown in region 14 of FIG. 1C. Pulling up the voltage of the WL to high voltage level turns on the transistor 12 of the memory basic unit M. Making the transistors, N1 and N2, of the pass gate turn on causes the logical status saved in the capacitor 10 of the memory basic unit M to be passed to the sense amplifier via a pair of BL and /BL. The voltage level of the pair of BL and /BL will be held at the original status, Vbleq, while the transistor 12 of the memory basic unit M is active. While there are electric charges in the capacitor 10, the voltage level of BL or /BL will increase as shown in 16 of FIG. 1C. On the contrary, while there are no any electric charges in the capacitor 10, the voltage level of BL or /BL will decrease. This is, the different logical status of the capacitor 10 causes different voltage of the bit lines. The voltage level of a connecting point NCS, which connects the transistors N3 and N4, decreases to a logical low level, Vss. The voltage level of a connecting point PCS, which connects the transistors P1 and P2, increases to a logical high level, Vblh. The voltage of the bit line with Vbleq level will decrease to the logical low level, Vss; the voltage of the bit line with higher than Vbleq level will increase to the logical high level, Vblh. As mentioned above, these processes are a procedure of memory writing back. Through the procedure, the logical status of the memory can retain the best logical level (Vblh, Vss).

The DRAM consumes much more power than other kinds of memory devices because of its continuous writing back processes. Thus, the development of the DRAM trends toward the low power to decrease the power consumption and the inner operation voltage of the DRAM has been reducing from 5V, 3.3V, 2.5V to 1.8V etc. The operation voltage of the bit lines also has the same development trend toward the low voltage. The quantity of electric charges Q saved in the capacitor $$Q = C^* \Delta V, \text{ wherein } \Delta V = Vblh - Vbleq$$

According to the formula, the quantity of electric charges Q in the capacitor will decrease while the operation voltage of the bit lines reduces and making the $\Delta V$ smaller. When the quantity of electric charges Q is decreasing, as shown in 16 of FIG. 1C, the differential voltage becomes smaller or the charging time is longer. Not only does the sense rate of the bit lines to the capacitors become slower but also the sense of logical status and the reliability of judgment also become poorer. Moreover, both the data retention time and the writing back cycle also become shorter.

Toward the development trend of the low operation voltage of the DRAM, the problems of how to keep the sense rate of the bit lines, how to retain the reliability of the logical sense and how to hold the data retention time are necessary to be overcome.

SUMMARY OF THE INVENTION

According to the shortcomings mentioned in the background, the present invention provides a memory device for improving the foregoing drawbacks.

Accordingly, one object of the present invention is to provide a memory device with high charging voltage bit lines for saving more electric charges in the capacitors while the bit lines are operated under the lower voltage.

Another object is to provide a memory device with high charging voltage bit lines for saving more electric charges in the capacitors to improve the slower sense rate, the lower reliability of the logical sense, and a shorter data retention time.

According to the objects mentioned above, the present invention provides a memory device and a method with high charging voltage bit lines, including: a plurality of memory cells, a plurality of sense amplifiers and a plurality of high charging voltage bit line circuits. The plurality of memory cells are used in storing data and electrically couple with the plurality of bit line pairs. The plurality of sense amplifiers with a plurality of sense nodes, which electrically couple with the plurality of bit line pairs, are used in sensing the differential voltage of the plurality of sense nodes while the plurality of memory cells are active. The plurality of high charging voltage circuits are used in providing a charging voltage, which is higher than the logical high voltage of the plurality of memory cells, for charging the plurality of memory cells. By doing so, the capacitors can save more electric charges to improve the slower sense rate, the lower reliability of logical sense and the shorter data retention time while the bit lines have the lower operation voltage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The preferred embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Moreover, each part of the illustrations is not drawn to a fixed scale in order to provide a clear description for easy understanding the present invention. Some sizes and relative proportions are magnified and irrelevant details are not drawn to make the illustrations concise.

Figure 1A:
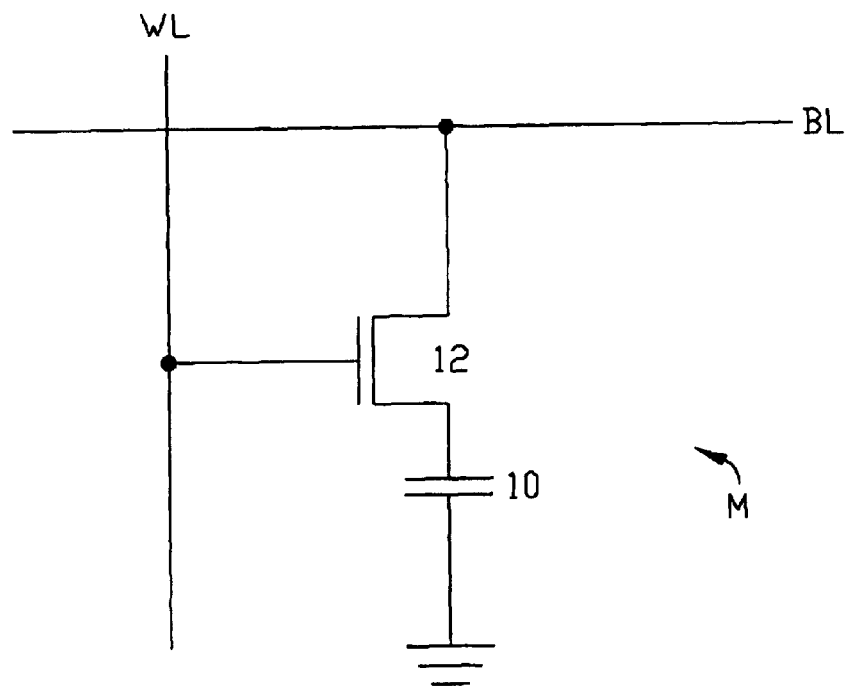
FIG. 1A illustrates a well-known memory cell.
Figure 1B:
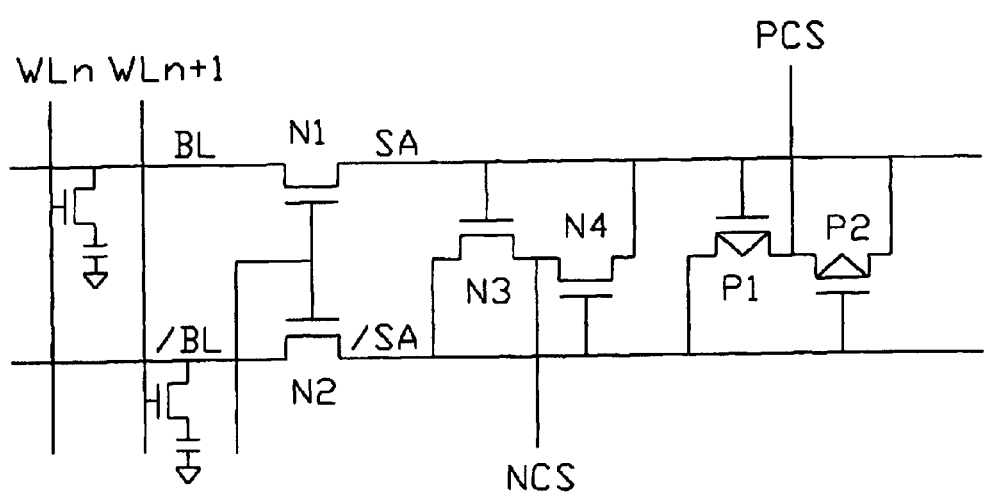
FIG. 1B illustrate a well-known memory device.
Figure 1C:
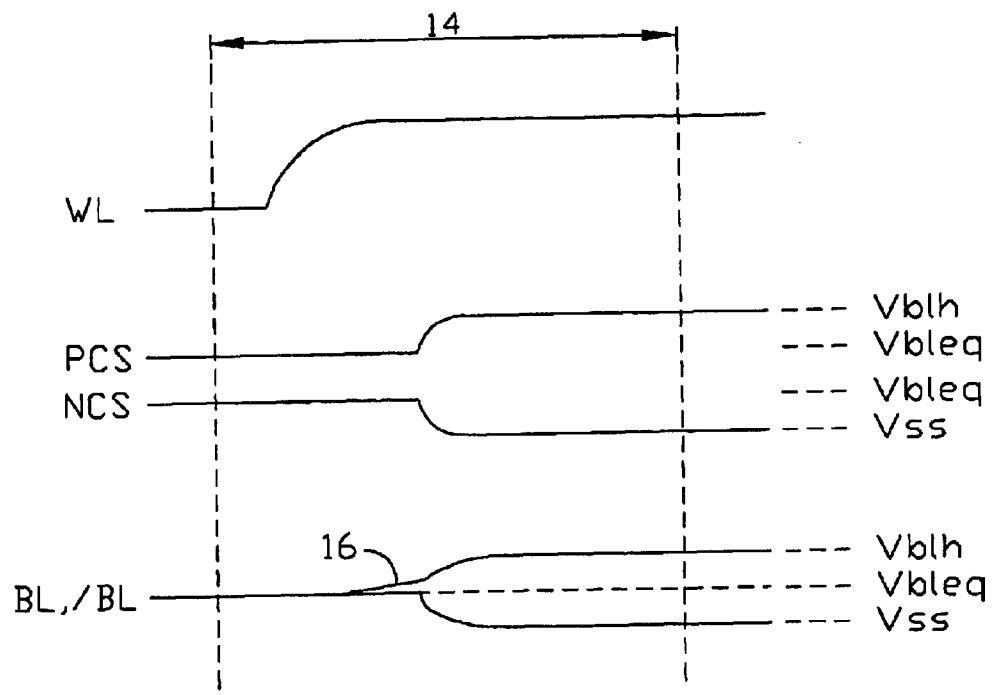
FIG. 1C shows the changes of the logical status of a well-know memory device in the active status.
Figure 1D:
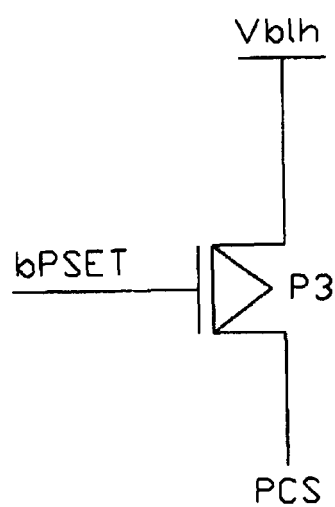
FIG. 1D shows a well-known charging voltage bit line circuit in a well-known memory device.

In accordance with the formula mentioned in the background, it can be achieved to increase electric charges Q in the capacitors of the memory by increasing ΔV. This is, while a writing back procedure is operating, the voltage level of the connecting point PCS should be higher than the logical high voltage level, Vblh. Herein, the connecting point PCS connects two P type transistors, P1 and P2, of the sense amplifier. A well-known voltage resource circuit, PCS, is shown in FIG. 1D. When a signal bPSET falls from a high voltage level to low voltage level, the P type transistor P3 will be turn on and make the voltage of the connecting point PCS become Vblh to provide the high voltage only.

Figure 2A:
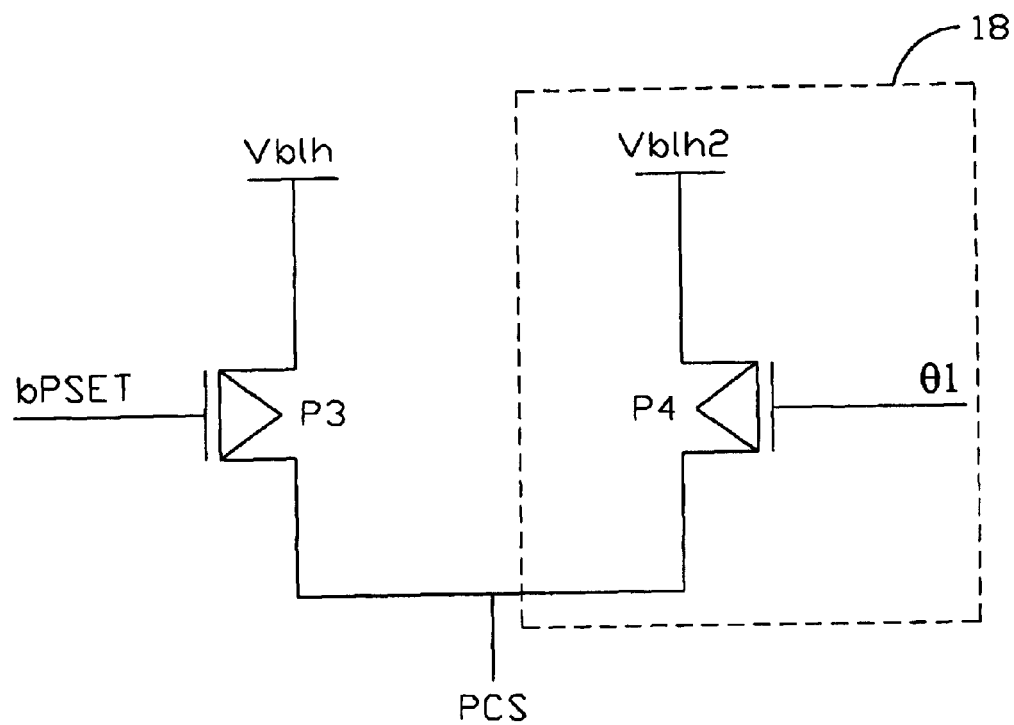
FIG. 2A shows the high charging voltage bit line circuit in accordance with the present invention.

The preferred embodiment of the present invention is shown in FIG. 2A. Adding a high charging voltage bit line circuit 18 makes PCS couple with a voltage level Vblh2, which is higher than the logical high voltage level Vblh, and using a control signal θ1 to turn on or turn off the P type transistor P4 to make the circuit work or not. By doing so, the connecting point PCS can provide not only Vblh but also a higher voltage, Vblh2.

Figure 2B:
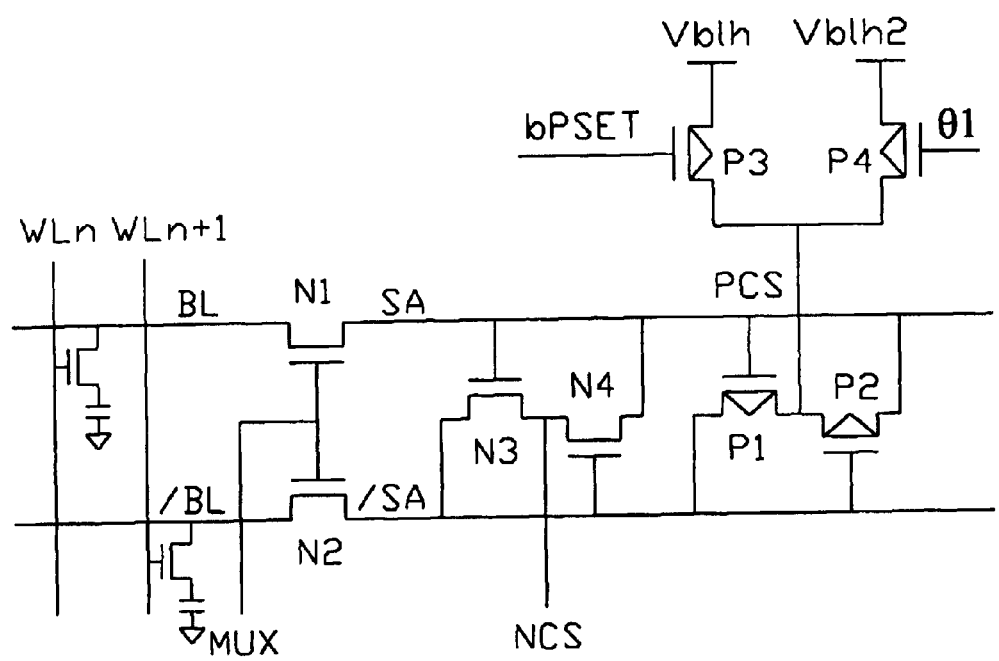
FIG. 2B shows the memory device in accordance with the present invention with a high charging voltage bit line circuit.
Figure 2C:
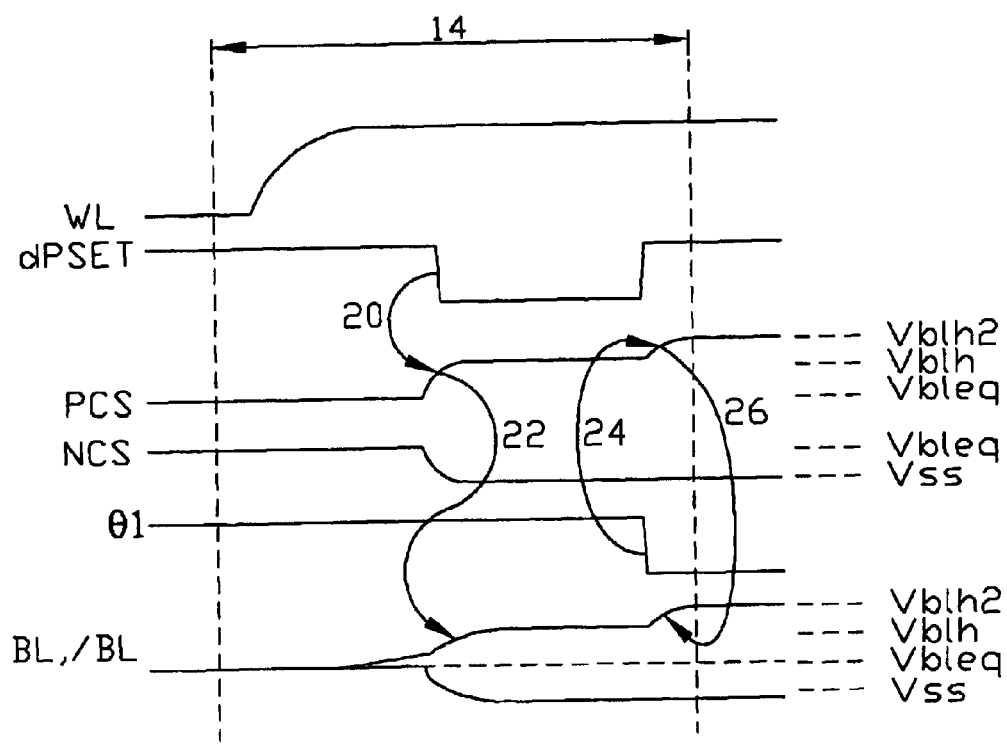
FIG. 2C shows the changes of the logical status of the memory device in accordance with the present invention with high charging voltage bit line circuits in the active status.

FIG. 2B illustrates the memory device in accordance with the present invention with high charging voltage bit lines, and FIG. 2C shows the timings of the memory device in FIG. 2B. Pulling up the voltage level of WL to high voltage level makes the transistor of the memory basic unit turn on. Making the transistors, N1 and N2, of the pass gate turn on causes the logical status saved in the capacitor of the memory basic unit to be passed to the sense amplifier via a pair of BL and /BL. The voltage level of BL or /BL depends on the electric charges in the capacitor. The voltage level of BL or /BL will be lower than the Vbleq while there are no any electric charges in the capacitor. On the contrary, the voltage level of BL or /BL will increase to make differences while there are electric charges in the capacitor. Making the voltage level of the connecting point NCS, which connects the transistors N3 and N4, decrease to the logical low level, Vss. The voltage level of the connecting point PCS, which connects the transistors P1 and P2, rises to the logical high level, Vblh, since the signal bPSET decreases from logical high level to logical low level, as shown in process 20. The voltage of the bit line with Vbleq level will decrease to the logical low level Vss; the voltage of the bit line which is higher than Vbleq level will increase to the logical high level Vblh, as shown in process 22. Then, the signal bPSET returns to the high voltage level and makes the transistor P3 turn off, simultaneously, the voltage level of the signal θ1 falls from high to low to enable transistor P4, making the voltage of PCS rise toward Vblh2 as shown in process 24, and also makes the voltage of the bit lines rise towards Vblh2. By doing so, the ΔV=Vblh2-Vbleq>Vblh-Vbleq, thus the electric charges in the capacitor increase to make the sense rate of bit lines faster and to improve the data retention time. The voltage Vblh2 should be higher than the voltage Vblh, and the practical voltage can be designed by depending on different environments to meet the practical needs. As to the signal θ1 enabling the high charging voltage bit line circuit 18, the only requirement is that the enabling point cannot be earlier than the time point of the signal bPSEIT changes from high to low. The interval between the θ1 and the bPSET can be adjusted by depending on different environments.

According to the spirit of the present invention, the voltage resource can be enabled after receiving a signal during the write back cycle to make the voltage of PCS directly turn into the Vblh2. And, it is unnecessary to transform the logical high voltage level, Vblh, into the Vblh2.

As mention above, the present invention discloses a memory device with high charging voltage bit lines. Wherein the high charging voltage bit lines provide a voltage, which is higher than the logical high voltage level, for saving more electric charges in the capacitors during the write back cycles while the bit lines are operated in the low operation power. Saving more electric charges in the capacitor can solve the problems of the slower sense rate, the lower reliability of logical sense, and the shorter data retention time.

Although specific embodiments have been illustrated and described, it will be obvious to those skilled in the art that various modifications may be made without departing from what is intended to be limited solely by the appended claims.

What is claimed is:

1. A memory device with high charging voltage bit lines, said memory device comprising:

a plurality of memory cells having a logical high voltage level, storing data and being electrically coupled with a plurality of bit line pairs;

a plurality of sense amplifiers with a plurality of sense node pairs, wherein said plurality of sense node pairs are electrically coupled with said plurality of bit line pairs, and said plurality of sense amplifiers sense the differential voltage of said plurality of sense node pairs while said plurality of memory cells are active; and a plurality of high charging voltage bit line circuits having a plurality of voltage charging circuits for providing a charging voltage level, wherein said charging voltage level is higher than said logical high voltage level of said plurality of memory cells to charge said plurality of memory cells.

2. The memory device according to claim 1, wherein said plurality of bit line pairs have the same voltage level before said plurality of memory cells are active.

3. The memory device according to claim 1, wherein the voltage level of said plurality of bit line pairs, which are electrically coupled with said plurality of memory cells, rises after said plurality of memory cells with electric charges are active.

4. The memory device according to claim 1, wherein the voltage level of said plurality of bit line pair, which are electrically coupled with said plurality of memory cells, keeps the original status after said plurality of memory cells.

5. The memory device according to claim 1, wherein said plurality of high charging voltage bit line circuits comprise a plurality of voltage level circuits to provide said logical high voltage level for said plurality of memory cells.

6. The memory device according to claim 5, wherein said plurality of high charging voltage bit line circuits provide said logical high voltage level and said charging voltage level in proper sequence.

7. The memory device according to claim 5, wherein when said plurality of voltage level circuits provide said logical high voltage level, said plurality of charging voltage level circuits are off.

8. The memory device according to claim 5, wherein when said plurality of charging voltage level circuits provide said charging voltage level, said plurality of voltage level circuits are off.

9. A memory device with high charging voltage bit lines, said memory device comprising:
   a plurality of memory cells having a logical high voltage level, storing data and being electrically coupled with a plurality of bit line pairs;
   a plurality of pass gates for turning said plurality of bit line pairs on when said plurality of memory cells are accessed;
   a plurality of sense amplifiers with a plurality of sense node pairs, wherein said plurality of sense node pairs are electrically coupled with said plurality of bit line pairs, and said plurality of sense amplifiers sense the differential voltage of said plurality of sense node pairs while said plurality of memory cells are active; and
   a plurality of high charging voltage bit line circuits having a plurality of voltage charging circuits for providing a charging voltage level, wherein said charging voltage level is higher than said logical high voltage level of said plurality of memory cells to charge said plurality of memory cells.

10. The memory device according to claim 9, wherein said plurality of bit line pairs have the same voltage level before said plurality of memory cells are active.

11. The memory device according to claim 9, wherein the voltage level of said plurality of bit line pairs which are electrically coupled with said plurality or memory cells, rises after said plurality of pass gates are turned on and said plurality of memory cells have electric charges.

12. The memory device according to claim 9, wherein the voltage level of said plurality of bit line pairs, which are electrically coupled with said plurality of memory cells, keeps the original status after said plurality of pass gates are turn on but said plurality of memory cells have no electric charges.

13. The memory device according to claim 9, wherein said plurality of high charging voltage bit line circuits comprise a plurality of voltage level circuits to provide said logical high voltage level for said plurality of memory cells.

14. The memory device according to claim 13, wherein said plurality of high charging voltage bit line circuits provide said logical high voltage level and said charging voltage level in proper sequence.

15. The memory device according to claim 13, wherein when said plurality of voltage level circuits provide said logical high voltage level, said plurality of charging voltage level circuits are off.

16. The memory device according to claim 13, wherein when said plurality or charging voltage level circuits provide said charging voltage level, said plurality of voltage level circuits are off.

17. A method of charging memory cells, wherein using a voltage, which is higher than the logical high voltage level of memory, to charge memory cells, comprising:
   enabling said plurality of memory cells, wherein said plurality of memory cells are electrically coupled with a plurality of bit line pairs;
   sensing and amplifying the differential voltage of a plurality of sense node pairs while said plurality of memory cells are active; and
   providing a high charging voltage for charging said plurality of memory cells, wherein said high charging voltage is higher than the logical high voltage level of said plurality of memory cells.

18. The method according to claim 17, wherein a charging sequence of said memory cells is said logical high voltage level and said charging voltage level in proper sequence.

19. The method according to claim 17, wherein said method comprises a plurality of pass gates to enable said plurality of bit line pairs while said plurality of memory cells are active.

20. A memory device with high charging voltage bit lines, said memory device comprising:
   a plurality of memory cells having a logical high voltage level, storing data and being electrically coupled with a plurality of bit line pairs;
   a plurality of sense amplifiers with a plurality of sense node pairs, wherein said plurality of sense node pairs are electrically coupled with said plurality of bit line pairs, and said plurality of sense amplifiers sense the differential voltage of said plurality of sense node pairs while said plurality of memory cells are active; and
   a plurality of high charging volts bit line circuits having a plurality of voltage charging circuits for providing a charging voltage level and a plurality of voltage level circuits to provide said logical high voltage level for said plurality of memory cells, wherein said charging voltage level is higher than said logical high voltage level of said plurality of memory cells to charge said plurality of memory cells.

* * * * *